United States Patent [19]
Ikeda

[11] Patent Number: 5,727,073
[45] Date of Patent: Mar. 10, 1998

[54] NOISE CANCELLING METHOD AND NOISE CANCELLER WITH VARIABLE STEP SIZE BASED ON SNR

[75] Inventor: Shigeji Ikeda, Tokyo, Japan

[73] Assignee: NEC Corporation, Japan

[21] Appl. No.: 673,343

[22] Filed: Jun. 28, 1996

[30] Foreign Application Priority Data

Jun. 30, 1995 [JP] Japan ................................ 7-165117

[51] Int. Cl.$^6$ ..................................... H04B 15/00
[52] U.S. Cl. ..................... 381/94.7; 364/574; 375/346
[58] Field of Search ............... 381/94, 71; 364/724.19, 364/724.2, 574, 572; 375/232, 254, 285, 284, 278, 296, 346, 350

[56] References Cited

U.S. PATENT DOCUMENTS

| | | | |
|---|---|---|---|
| 4,658,426 | 4/1987 | Chabries et al. | 381/94 |
| 4,939,685 | 7/1990 | Feintuch | 364/724.19 |
| 5,230,007 | 7/1993 | Baum | 364/724.2 |
| 5,359,628 | 10/1994 | Muto | 364/724.2 |
| 5,448,601 | 9/1995 | Choi | 364/724.2 |
| 5,475,632 | 12/1995 | Sugiyama | 364/724.19 |
| 5,535,149 | 7/1996 | Mori et al. | 364/724.19 |

FOREIGN PATENT DOCUMENTS 9402991  2/1994  WIPO.

OTHER PUBLICATIONS

B. Widrow, et al., "Adaptive Noise Cancelling: Principles and Applications", Proceedings of the IEEE, vol. 63, No. 12, Dec. 1975, pp. 1692–1716.

J.-I. Nagumo, et al., "A Learning Method for System Identification", IEEE Transactions on Automatic Control, vol. AC–12, No. 3, Jun. 1967, pp. 282–287.

R. W. Harris, et al., "A Variable Step (VS) Adaptive Filter Algorithm", IEEE Transactions on Acoustics, Speech, and Signal Processing, vol. ASSP–34, No. 2, Apr. 1986, pp. 309–316.

R. A. Goubran et al., "Acoustic Noise Suppression Using Regressive Adaptive Filtering", 40th IEEE Vehicular Technology Conf., May 6–9, 1990, Orlando, Florida, pp. 48–53.

*Primary Examiner*—Curtis Kuntz
*Assistant Examiner*—Ping W. Lee
*Attorney, Agent, or Firm*—Ostrolenk, Faber, Gerb & Soffen, LLP

[57] ABSTRACT

The object of the present invention is to provide a noise cancelling method and a noise canceller where the shortening of the convergence time and the reduction in the distortion (residual error) after the convergence can be realized.

A second adaptive filter outputs a pseudo noise signal by receiving a reference signal from a reference signal input terminal. A subtracter subtracts an output pseudo noise signal of the second adaptive filter from a receiving signal input from a speech signal input terminal, and supplies the subtraction result to the second adaptive filter as an error signal. A divisor circuit divides an output speech signal power of a power averaging circuit obtained from the output error signal of the subtracter by an output noise signal power of another power averaging circuit obtained from the output pseudo noise signal of the second adaptive filter, and outputs the result of the division as an estimated value of the signal to noise ratio (SNR). A step size output circuit operates so as to receive the output signal of a signal to noise ratio estimating circuit as an input, and output a value corresponding to the input SNR value as the step size for a first adaptive filter.

5 Claims, 2 Drawing Sheets

NOISE CANCELLING METHOD AND NOISE CANCELLER WITH VARIABLE STEP SIZE BASED ON SNR

BACKGROUND OF THE INVENTION

1. Field of the Invention

The present invention relates to a noise cancelling method and a noise canceller, and more particularly, to a noise cancelling method and a noise canceller for eliminating background noise signal intermingled with a speech signal input from a microphone, a handset or the like by means of an adaptive filter.

2. Description of the Prior Art

The background noise signal intermingled with the speech signal input from the microphone, handset or the like becomes a serious problem in a narrow band voice encoder with high degree of information compression, a speech recognition system or the like. A two-input noise canceller employing an adaptive filter, as such a noise canceller aimed at eliminating the acoustically superposed noise component, is disclosed in Proceedings of IEEE, Vol. 63, No. 12, 1975, pp. 1692–1716 (referred to as Reference 1 hereinafter).

This two-input noise canceller generates a pseudo noise signal (noise replica) corresponding to the noise signal component crept into a speech input terminal by the use of an adaptive filter which approximates the impulse response of a route (noise path) through which the noise signal input to a reference input terminal passes before it reaches the speech input terminal. The noise canceller operates to suppress the noise signal by subtracting the pseudo noise signal from a receiving signal (mixed signal of the speech signal and the noise signal) input to the speech input terminal. In this case, it is filter coefficients of the adaptive filter that act to suppress the noise signal by subtracting the pseudo noise signal from the receiving signal.

In that operation, the filter coefficients of the adaptive filter are updated by taking the correlation between the error signal obtained by subtracting the pseudo noise signal from the receiving signal and the reference signal received at the reference signal input terminal. Representative examples of such method of coefficient adaptation, that is, convergence algorithm, of the adaptive filter are the least mean square (LMS) algorithm described in Reference 1 and the learning identification method (LIM) described in IEEE Transactions on Automatic Control, Vol. 12, No. 3, 1967, pp. 282–287 (referred to as Reference 2 hereinafter).

FIG. 2 shows a block diagram of an example of conventional noise canceller. A speech signal input to a speech input terminal 1 after undergoing acoustoelectric conversion mediated by, for example, a microphone placed near the mouth of a speaker is intermingled with background noise. On the other hand, a signal which is acoustoelectrically converted by a microphone placed at a location away from the speaker corresponds substantially to the background noise signal crept into the speech input terminal 1. A signal (called receiving signal) input to the speech input terminal 1 where the speech signal and the background noise signal are present intermingled in this manner, is supplied to a subtracter 4. A noise signal input to a reference input terminal 2 is supplied to an adaptive filter 3 as a reference noise signal.

The subtracter 4 cancels the noise signal component in the receiving signal by subtracting the pseudo noise signal generated by the adaptive filter 3 from the receiving signal coming from the input terminal 1, and outputs the error signal after the cancellation to an output terminal 5. The adaptive filter 3 successively updates the filter coefficients based on the reference noise signal supplied from the reference input terminal 2, the error signal supplied from the subtracter 4 and step size α set for the coefficient update. As the update algorithm for the filter coefficients use is made of the LMS algorithm described in Reference 1 or the LIM described in Reference 2.

Now, if the speech signal component and the noise signal component which is the object of cancellation, of the receiving signal input from the speech input terminal 1 are called s(k) and n(k) (where k is an index representing the time) respectively, the receiving signal y(k) supplied to the subtracter 4 from the speech input terminal 1 is expressed by the following equation.

$$y(k) = s(k) + n(k). \tag{1}$$

The adaptive filter 3 operates so as to generate a pseudo noise signal r(k) corresponding to the noise signal component n(k) in Eq. (1) with a reference noise signal x(k) input from the reference input terminal 2 as an input. The subtracter 4 outputs an error signal e(k) by subtracting the pseudo noise signal r(k) from the receiving signal y(k). Here, if one neglects an additive noise component a(k) on the ground that it is sufficiently small compared with s(k), the error signal e(k) can be represented by the following expression.

$$e(k) = s(k) + n(k) - r(k). \tag{2}$$

Here, a method of updating the filter coefficients will be described by assuming the LMS algorithm in Reference 1 as an updating algorithm of the filter coefficients of the adaptive filter 3. If the j-th filter coefficient of the adaptive filter 3 at the time k is called $w_j(k)$, the pseudo noise signal r(k) output by the adaptive filter 3 is expressed by the following Eq. (3).

$$r(k) = \sum_{j=0}^{N-1} w_j(k) x(k-j), \tag{3}$$

where N stands for the tap number of the adaptive filter.

The error signal e(k) can be found by substituting the pseudo noise signal r(k) as represented by Eq. (3) into Eq. (2). Using the error signal thus obtained the coefficient $w_j(k+1)$ at the time (k+1) can be computed according to the following formula.

$$w_j(k+1) = w_j(k) + \alpha \cdot e(k) x(k-j). \tag{4}$$

In Eq. (4), α is a constant called step size, and is a parameter which decides the convergence time and the residual error after convergence.

On the other hand, the coefficient update according to the LIM described in Reference 2 can be calculated by the following equation.

$$w_j(k+1) = w_j(k) + \frac{\mu \cdot e(k) \cdot x(k-j)}{\sum_{m=k-N+1}^{k} \{x(m)\}^2}, \tag{5}$$

where μ is the step size for the LIM. In the LIM, convergence more stable than by the LMS algorithm is realized by taking the step size μ to be inversely proportional to the mean power of the reference noise signal x(k) input to the adaptive filter.

For both cases of large value of the step size α for the LMS algorithm and the step size μ for the LIM, the convergence of the filter coefficients is fast because of the large correction value for the coefficients. On the other hand, the effect of a signal component interfering with the coefficient update, when there exists such a component, becomes conspicuous in proportion to the size of the correction amount, making the residual error large. On the contrary, when the value of the step size is small, the convergence becomes slow, but the effect of the component of the interfering signal is small and the residual error becomes small. Consequently, it can be seen that a trade-off exists between the convergence time and the residual error for the setting of the step size.

Now, since the object of the adaptive filter 3 of the noise canceller is to generate the pseudo noise signal component r(k) of the noise signal component n(k), the difference between n(k) and r(k), namely, the residual error (n(k) - r(k)) is required as the error signal for the coefficient update of the adaptive filter. However, the error signal e(k) contains the speech signal component s(k), as shown in Eq. (2), which affects strongly the coefficient update operation of the adaptive filter 3.

In the adaptive filter 3 used in the noise canceller, it is necessary to set the step size for the coefficient update to an extremely small value in order to reduce the effect of the speech signal component s(k) which is an interfering signal for the adaptive filter 3. However, reduction of the step size leads to a problem that the convergence of the filter coefficients of the adaptive filter is slowed down as mentioned above.

To resolve this problem, there is proposed a method in which the coefficient update is stopped by detecting the presence of a speech signal from the comparison of the mean power of the receiving signal y(k) and the mean power of the reference noise signal x(k), instead of setting the step size to a relatively large value. In this method, however, the detection of the speech signal s(k) depends upon the setting of a threshold. Consequently, depending upon the size relationship between the speech signal s(k) and the noise signal n(k), there arises a situation in which the residual error becomes large due to a delay in the detection of the speech signal s(k), or on the contrary, the convergence is delayed due to stop of the coefficient update despite the absence of the speech signal s(k). Moreover, when there is a speech signal, the coefficient update is stopped so that it is not possible to follow the variations in the system.

As a method to resolve the above-mentioned problem a method called VS algorithm is disclosed in IEEE Transaction on Accoustics, Speech and Signal Processing, Vol., 34, Nov. 2, 1986, pp. 309–316 (referred to as Reference 3 hereinafter).

In this VS algorithm, instead of using a common or a fixed step size for each filter coefficient, an individual step size given by a step size matrix is used for each filter coefficient, and the value of the step size is varied successively within a set control range. The method of variation of the step size is to control such that when the polarity of the gradient component of the filter coefficient changes consecutively for $m_0$ times, the step size is reduced to half, and when it does not change consecutively for $m_1$ times, the step size is doubled. Besides, the maximum value of the step size is specified by the reciprocal, 1/λ, of the maximum eigenvalue λ of the autocorrelation matrix, and its minimum value is specified by the residual error after the convergence.

In the VS algorithm, the convergence speed is increased by using for respective filter coefficients step sizes corresponding to variation of respective elements of the autocorrelation matrix, the convergence condition of the filter coefficients is decided by observing the gradients of the filter coefficients, and the residual error is reduced by decreasing the step size.

However, even in the VS algorithm, the fact remains that the error signal used for updating the coefficients of the adaptive filter contains the speech signal component which is an interfering signal. Accordingly, in order to ensure a stable operation of the device even in the case where a situation in which the noise signal component is extremely small compared with the speech signal component, that is, a situation in which the signal to noise ratio (SNR) at the speech input terminal is high, can be assumed, it is necessary to choose the values of $m_0$ and $m_1$ large, and set the minimum value of the step size small. However, such an arrangement slows down the convergence speed, and results in the problem that a sufficient cancelling performance cannot be expected under the condition of poor SNR.

SUMMARY OF THE INVENTION

Object of the Invention

The present invention was motivated in view of the aforementioned aspect, and it is therefore the object of this invention to provide a noise cancelling method and a noise canceller which is capable of realizing the shortening of the convergence time and the reduction of the distortion (residual error) after the convergence.

In order to achieve the above object, in a noise cancelling method by which a pseudo noise signal is generated by filtering in accordance with the filter coefficients by receiving a reference noise signal input from a reference input terminal, an error signal is generated by subtracting in a subtracter the pseudo noise signal from a receiving signal input from a receiving signal terminal, and a receiving signal with its noise cancelled is output from the subtracter by correcting successively the filter coefficients of the adaptive filter based on the error signal, a noise cancelling method according to this invention receives the reference signal and the receiving signal respectively, detects an error signal power and a pseudo noise signal power from the pseudo noise signal generated by using an adaptive filter similar to the above-mentioned adaptive filter estimates the signal to noise ratio of the receiving signal from the error signal power and the pseudo noise signal power, and adaptively varies the filter coefficients by using values corresponding to the estimated signal to noise ratio as a update amount of the filter coefficients.

Moreover, in order to achieve the above object, a noise canceller according to this invention includes a first adaptive filter which receives the reference noise signal input from the reference input terminal and outputs a first pseudo noise signal by filtering in accordance with the filter coefficients, a first subtracter which subtracts the first pseudo noise signal from the receiving signal input from the receiving signal input terminal, supplies the difference signal obtained as a result of the subtraction to the first adaptive filter as a first error signal, and outputs a receiving signal whose noise is cancelled to an output terminal, a signal to noise ratio estimating circuit which receives the reference noise signal from the reference signal input terminal and the receiving signal from the receiving signal input terminal as input signals, and obtains an estimated value of the signal to noise ratio of the receiving signal and a step size output circuit which outputs a step size for determining the correction amount of the filter coefficients of the first adaptive filter base on the output estimated value of the signal to noise ratio estimating circuit.

Furthermore, the signal to noise ratio estimating circuit consists of a second adaptive filter which receives the reference noise signal and outputs a second pseudo noise signal by a filtering in accordance with the filter coefficients, a second subtracter which subtracts the second pseudo noise signal from the receiving signal, and supplies the difference signal obtained as a result of the subtraction to the second adaptive filter as a second error signal, a first power averaging circuit which receives the second error signal, evaluates its means square value and outputs it as a receiving signal power, a second power averaging circuit which receives the second pseudo noise signal, evaluates its means square value and outputs it as a noise signal power, and a division circuit which divides the receiving signal power output from the first power averaging circuit by the noise signal power output from the second power averaging circuit and outputs it as an estimated value of the signal to noise ratio of the receiving signal.

In addition, the step size output circuit receives the estimated value output by the signal to noise ratio estimating circuit, and outputs a step size of relatively large value when the estimated value is small compared with the case when the estimated value is large.

Besides, the receiving signal is the superposed signal of the speech signal input to the receiving signal input terminal and the noise signal that creeps into the input terminal.

In the noise cancelling method and the noise canceller according to this invention, the second adaptive filter is so operated as to output the pseudo noise signal by receiving the reference signal, the signal to noise ratio of the receiving signal is estimated based on the mean power of the pseudo noise signal output by the second adaptive filter and the mean power of the difference signal obtained by subtracting the pseudo noise signal output by the second adaptive filter from the receiving signal, and the filter coefficients are varied adaptively by employing the values corresponding to the estimated signal to noise ratio as a update amount of the filter coefficients.

In other words, where the estimated value of the signal to noise ratio is small, a large step size is supplied to the first adaptive filter to improve the convergence speed by judging that the noise signal component to be cancelled is large compared with the signal that is the interfering component. On the contrary, where the estimated value is large, a small step size is supplied to the first adaptive filter to prevent the increase in the residual error by judging that the the signal that is the interfering component is larger than the noise signal component to be cancelled.

BRIEF DESCRIPTION OF THE DRAWINGS

The above and other objects, features and advantages of this invention will be more apparent by reference to the following detailed description of the invention taken in conjunction with the accompanying drawings, wherein.

DESCRIPTION OF THE PREFERRED EMBODIMENT

Figure 1:
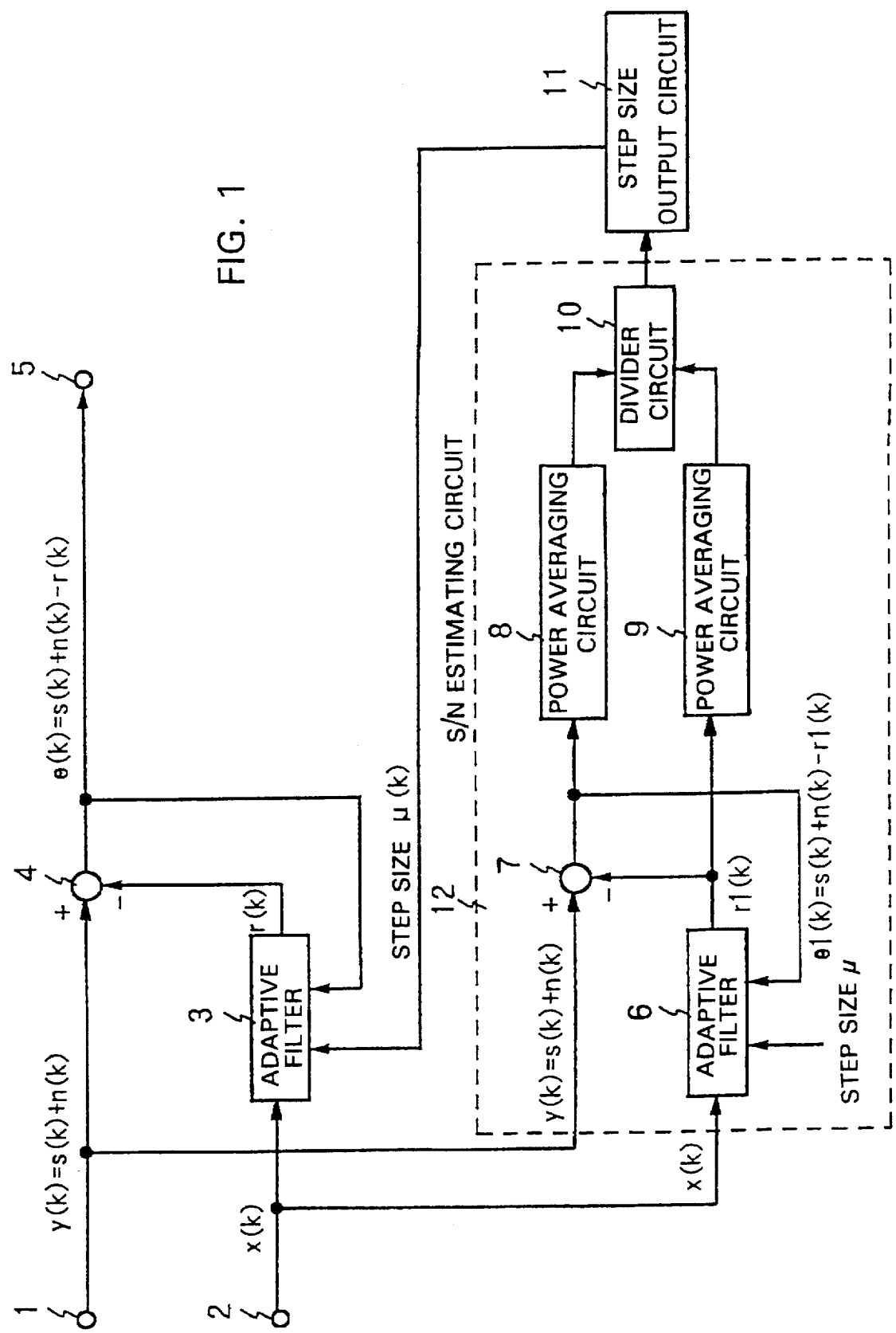
FIG. 1 is a block diagram of an embodiment of the invention.
Figure 2:
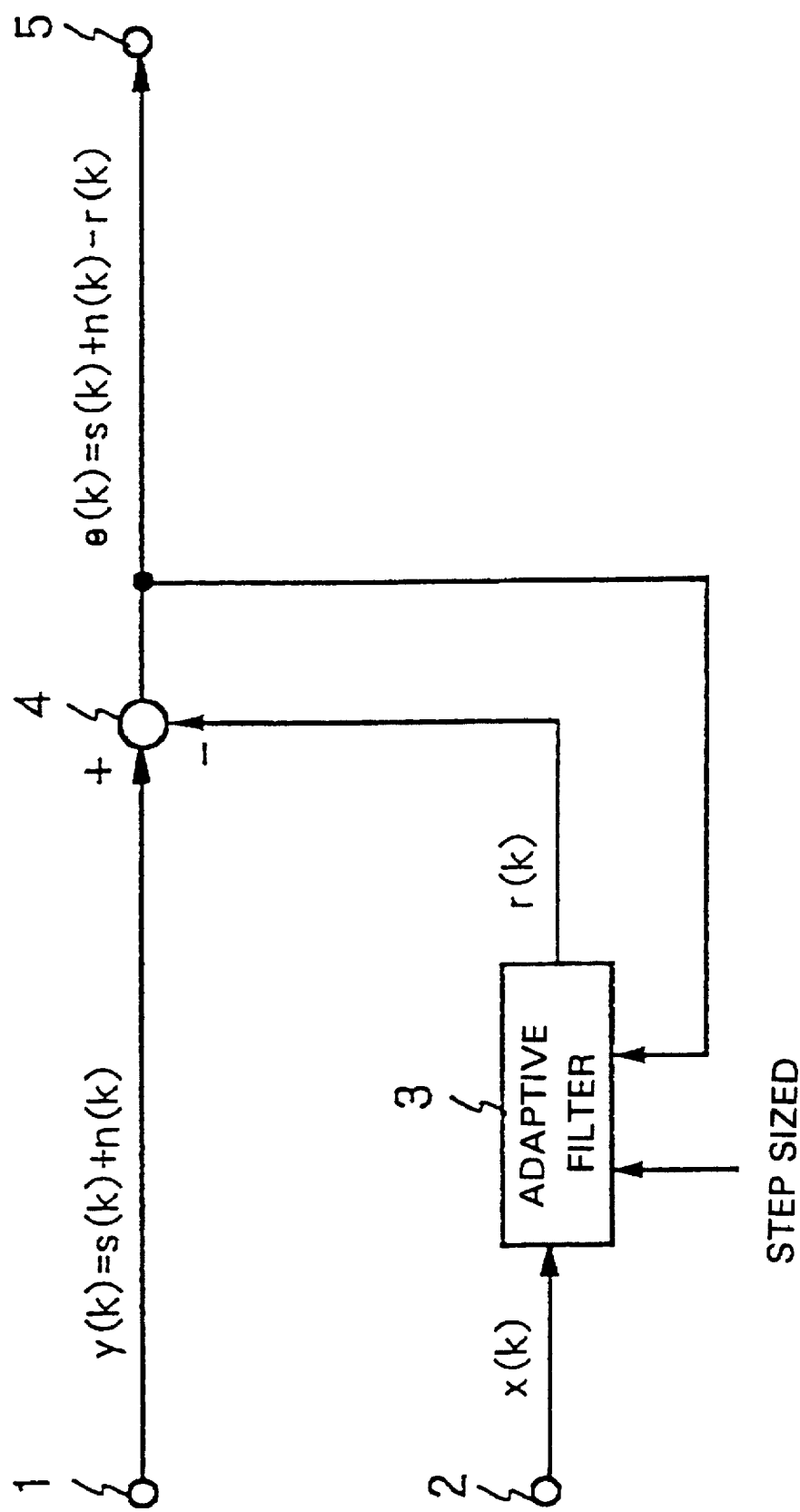
FIG. 2 is a block diagram of a conventional example.

Next, referring to a drawing, an embodiment of this invention will be described. FIG. 1 shows a block diagram of an embodiment of the invention. In the figure, identical symbols are given to components identical to those in FIG. 2. As shown in FIG. 1, this embodiment includes an adaptive filter 3, a subtracter 4, a step size output circuit 11 and a signal to noise ratio estimating circuit 12, and it is characterized in that the step size of the adaptive filter 3 is varied rather than fixed.

The step size output circuit 11 and the signal to noise ratio estimating circuit 12 are provided for controlling the step size of the adaptive filter 3. The signal to noise ratio estimating circuit 12 includes an adaptive filter 6 which receives a reference noise signal x(k) from the input terminal 2, a subtracter 7 which subtracts an output pseudo noise signal $r_1(k)$ of the adaptive filter 6 from the receiving signal y(k), power averaging circuits 8 and 9 which compute averages of the output signals of the adaptive filter 6 and the subtracter 7, respectively, and a divider circuit 10 which divides the output signal of the power averaging circuit 9 by the output signal of the power averaging circuit 8.

First, the operation of the signal to noise ratio estimating circuit 12 will be described. The adaptive filter 6 receives as input signals the reference noise signal x(k) the same as for the adaptive filter 3 from the input terminal 2 as well as the output error signal of the subtracter 7, and outputs a pseudo noise signal. The subtracter 7 subtracts the output pseudo noise signal of the adaptive filter 6 from the receiving signal input from the speech signal input terminal 1, and supplies the subtraction result to the adaptive filter 6 as the error signal. At this time, the step size for coefficient update of the adaptive filter 6 is set to a somewhat large value in order to increase the convergence speed. When the LIM is adopted as the algorithm for the coefficient update, the step size μ is set to a value, for example, in the range of 0.2 to 0.5.

Now, when the receiving signal is called y(k), the reference noise signal input to the adaptive filter 6 is called x(k), and the output pseudo noise signal of the adaptive filter 6 is called $r_1(k)$, the error signal $e_1(k)$ which is the output of the subtracter 7 is given by the following expression.

$$e_1(k)=y(k)-r_1(k). \tag{6}$$

Since the receiving signal y(k) is represented as the sum of the speech signal s(k) and the noise signal n(k), as shown in Eq. (1), Eq. (6) can be rewritten as in Eq. (7).

$$e_1(k)=s(k)+n(k)-r_1(k). \tag{7}$$

The output error signal $e_1(k)$ of the subtracter 7 is supplied to the adaptive filter 6 as the error signal for the coefficient update, and is supplied also to the power averaging circuit 8. The power averaging circuit 8 squares the error signal $e_1(k)$ and outputs its time average. The squared value $e_1^2(k)$ of the error signal $e_1(k)$ is given by Eq. (8).

$$e_1^2(k)=\{s(k)+n(k)-r_1(k)\}^2 \tag{8}$$

If one approximates the time average of the square value $e_1^2(k)$ by the expected value, then, since the speech signal s(k) and the reference noise signal x(k), and hence the speech signal s(k) and the noise signal n(k), are mutually independent, the expected value $E[e_1^2(k)]$ can be represented by the following expression.

$$E[e_1^2(k)]=E[s^2(k)]+E[\{n(k)-r_1(k)\}^2]. \tag{9}$$

The second term on the right-hand side of Eq. (9) represents the residual error component, and considering the fact that this term is to be made convergent at a high speed by setting the step size to a somewhat large value, the residual error component attenuates rapidly, so that the following equation can be obtained.

$$E[e_1^2(k)] \approx E[s^2(k)]. \quad (10)$$

Consequently, as shown in Eq. (10), the output signal of the power averaging circuit 8 approximates the speech signal power $s^2(k)$.

On the other hand, the power averaging circuit 9 squares the output pseudo noise signal $r_1(k)$ of the adaptive filter 6 and outputs its time average. From the fact that the output of the adaptive filter 6 converges at a high speed by setting the step size to a somewhat large value, the following equation is valid.

$$r_1(k) \approx n(k). \quad (11)$$

Accordingly, the expected value $E[r_1^2(k)]$ of the square value of $r_1^2(k)$ of the pseudo noise signal $r_1(k)$ can be approximated by the following expression.

$$E[r_1^2(k)] \approx E[n^2(k)]. \quad (12)$$

Therefore, the output signal of the power averaging circuit 9 approximates the noise signal power $n^2(k)$.

The division circuit 10 divides the output speech signal power of the power averaging circuit 8 by the output noise signal power of the power averaging circuit 9, and as a result, outputs the estimated value of the SNR. As described in the above, the signal to noise ratio estimating circuit 12 makes the adaptive filter 6, that outputs the pseudo noise signal, operate by receiving, as input signals, the receiving signal input from the speech signal input terminal 1 and the reference noise signal input from the reference signal input terminal 2, detects the error signal power and the pseudo noise signal power from such thing as the output pseudo noise signal of the adaptive filter, and estimates SNR based on these powers.

Next, the operation of the step size output circuit 11 will be described. The step size output circuit 11 receives the output of the signal to noise ratio estimating circuit 12 as an input, and operates so as to output a value corresponding to the input SNR value as the step size of the adaptive filter 3. In this case the step size output circuit 11 outputs a small step size when the SNR is large, and on the contrary, outputs a large step size when the SNR is small. Here, if the SNR value and the step size at the time k are designated by SNR(k) and $\mu(k)$, respectively, their relationship may be represented by, for example, the following Eq. (13).

$$\mu(k) = clip[\mu_0 \cdot 1/SNR(k), \mu_{max}, \mu_{min}], \quad (13)$$

where $\mu_0$ is a constant which is set to a value, for example, in the range of 0.1 to 0.5. Moreover, clip [a,b,c] is a function of a, b, and c defined by the following conditions.

$$clip[a,b,c] = a \quad (c \leq a \leq b), \quad (14a)$$

$$clip[a,b,c] = b \quad (a > b), \quad (14b)$$

$$clip[a,b,c] = c \quad (a < c), \quad (14c)$$

Here, if it is assumed that $\mu_0 = 0.1$, $\mu_{max} = 0.5$ and $\mu_{min} = 0.01$, then Eq. (13) will be represented by Eq. (15) below.

$$\mu(k) = clip[0.1/SNR(k), 0.5, 0.01]. \quad (15)$$

Consequently, in this case, if SNR is 0 dB, that is, SNR(k) =1, the step size is 0.1 from Eq. (14a). Further, if SNR is 10 dB, that is, SNR(k)=10, the step size is 0.01 again from Eq. (14a). However, if SNR is −10 dB, that is, SNR(k)=0.1, the step size is restricted by its maximum value and is set to 0.5 from Eq. (14). Similarly, if SNR is 20 dB, that is SNR(k)= 100, the step size is restricted by its minimum value and is given by 0.01 from Eq. (14c).

The setting of such a restriction range of the step size is effective for a stable operation of the adaptive filter. In this way, the step size output circuit 11 controls the step size to be supplied to the adaptive filter 3 in accordance with the SNR value estimated by the signal to noise ratio estimating circuit 12.

As described above, the noise canceller of this embodiment is so arranged as to control the step size to be supplied to the adaptive filter 3 in accordance with the estimated SNR value. Accordingly, it is possible to accelerate the convergence of the filter coefficients without being affected by the interfering signal by increasing the step size for a section where no speech signal is present or for a section where the speech signal, even if it exists, is very weak compared with the noise signal component. On the other hand, it is possible to prevent the increase in the residual error due to the interfering signal by reducing the step size for a section where the speech signal component is strong compared with the noise signal component.

Besides, under the condition where the absolute quantity of the noise signal component is small, namely, under the condition where the adaptive filter cannot operate stably, it is possible to stop the coefficient update by setting $\mu_{min}$ to zero.

As has been described in the above, in accordance with this invention, the signal to noise ratio of the receiving signal is estimated, the size relationship between the signal being the interfering component and the noise signal component to be cancelled is judged based on the estimated value, and the filter coefficients of the first adaptive filter are varied adaptively. Accordingly, it is possible to realize a high speed convergence of the filter coefficients and a reduction in the residual error even under the condition where the signal to noise ratio of the receiving signal is varying conspicuously.

Although the present invention has been fully described by way of the preferred embodiment thereof with reference to the accompanying drawings, various changes and modifications will be apparent to those having skills in this field. Therefore, unless these changes and modifications otherwise depart from the scope of the present invention, they should be construed as included therein.

What is claimed is:

1. In a noise cancelling method generating a pseudo noise signal through filtering in accordance with filter coefficients by receiving a reference noise signal input from a reference signal input terminal to a first adaptive filter, generating a first error signal by means of a subtracter by subtracting the pseudo noise signal from a receiving signal input from a receiving signal input terminal, and outputting said receiving signal with its noise cancelled from said subtracter by successively correcting the filter coefficients of said adaptive filter based on the error signal, the noise cancelling method characterized in that it receives respectively said reference signal and said receiving signal, detects an error signal power and a pseudo noise signal power from a second error noise signal generated by using a second adaptive filter similar to said first adaptive filter, estimates the signal to noise ratio of said receiving signal from the error signal power and the pseudo noise signal power, and varies the filter coefficients of said first adaptive filter adaptively by using a value corresponding to an estimated signal to noise ratio as the update amount for said filter coefficients of said first adaptive filter.

2. A noise canceller comprising:

a first adaptive filter which outputs a first pseudo noise signal through filtering in accordance with filter coefficients by receiving a reference noise signal input from a reference signal input terminal;

a first subtracter which subtracts said first pseudo noise signal from a receiving signal input from a receiving signal input terminal, supplies the difference signal obtained as a result of the subtraction to said first adaptive filter as a first error signal, and outputs said receiving signal with its noise cancelled to an output terminal;

a signal to noise ratio estimating circuit which receives the reference noise signal from said reference signal input terminal and the receiving signal from said receiving signal input terminal as input signals and obtains an estimated value of the signal to noise ratio of said receiving signal; and a step size output circuit which outputs a step size that determines a update value of the filter coefficients of said first adaptive filter based on the output estimated value of the signal to noise ratio estimating circuit.

3. A noise canceller as claimed in claim 2, wherein said signal to noise ratio estimating circuit comprises:

a second adaptive filter which inputs said reference noise signal and outputs a second pseudo noise signal through filtering in accordance with the filter coefficients of said second adaptive filter;

a second subtracter which subtracts said second pseudo noise signal from said receiving signal and supplies the difference signal obtained as a result of the subtraction to said second adaptive filter as a second error signal;

a first power averaging circuit which receives the second error signal, evaluates its mean square value and outputs the result as a receiving signal power;

a second power averaging circuit which receives said second pseudo noise signal, evaluates its means square value and outputs the result as a noise signal power; and a divisor circuit which divides the receiving signal power output from said first power averaging circuit by the noise signal power output from said second power averaging circuit and outputs the result as the estimated value of the signal to noise ratio of said receiving signal.

4. A noise canceller as claimed in claim 2, wherein said step size output circuit receives said estimated value outputted by said signal to noise ratio estimating circuit as an input and outputs, when the estimated value is small, said step size which is relatively large compared with the case when the estimated value is large.

5. A noise canceller as claimed in claim 2, wherein said receiving signal is a superposed signal of a speech signal input to said receiving signal input terminal and a noise signal intermingled into the input terminal.

* * * * *